(12) United States Patent
Shimomura

(10) Patent No.: US 6,711,708 B1
(45) Date of Patent: Mar. 23, 2004

(54) BOUNDARY-SCAN TEST METHOD AND DEVICE

(75) Inventor: Takehiko Shimomura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/377,630

(22) Filed: Aug. 19, 1999

(30) Foreign Application Priority Data

Mar. 23, 1999 (JP) .......................................... 11-078392

(51) Int. Cl.[7] .............................................. G01R 31/28
(52) U.S. Cl. ........................ 714/727; 714/729; 714/730
(58) Field of Search ................................ 714/726, 727, 714/729, 730

(56) References Cited

U.S. PATENT DOCUMENTS

| | | | | |
|---|---|---|---|---|
| 4,931,722 A | * | 6/1990 | Stoica ........................ | 714/733 |
| 5,150,044 A | * | 9/1992 | Hashizume et al. ......... | 324/763 |
| 5,260,949 A | * | 11/1993 | Hashizume et al. ......... | 714/731 |
| 5,325,368 A | * | 6/1994 | James et al. ................ | 714/727 |
| 5,343,478 A | * | 8/1994 | James et al. ................ | 714/726 |
| 5,377,198 A | * | 12/1994 | Simpson et al. ............ | 714/727 |
| 5,477,545 A | * | 12/1995 | Huang ........................ | 714/727 |
| 5,642,363 A | * | 6/1997 | Smith ......................... | 714/729 |
| 5,710,779 A | * | 1/1998 | Whetsel ...................... | 714/726 |
| 5,841,791 A | * | 11/1998 | Hashizume ................. | 714/726 |
| 5,909,453 A | * | 6/1999 | Kelem et al. ............... | 714/727 |
| 6,260,165 B1 | * | 7/2001 | Whetsel ...................... | 714/727 |
| 6,314,539 B1 | * | 11/2001 | Jacobson et al. ........... | 714/727 |
| 6,343,365 B1 | * | 1/2002 | Matsuzawa et al. ........ | 714/726 |
| 6,351,836 B1 | * | 2/2002 | Tsujii ......................... | 714/727 |

FOREIGN PATENT DOCUMENTS

| | | |
|---|---|---|
| JP | 4-211842 | 8/1992 |
| JP | 6-174795 | 6/1994 |
| JP | 10-19983 | 1/1998 |

OTHER PUBLICATIONS

Narayanan, S. and Breuer, M.A.; Reconfigurable scan chains: A novel approach to reduce test application time; 1993 Digest of Technical Papers IEEE/ACM International Conference on Computer–Aided Design, 1993, Page(s): 710–715.*

Narayanan, S. and Breuer, M.A.; Reconfiguration techniques for a single scan chain; IEEE Transactions on Computer–Aided Design of Integrated Circuits and Systems, vol.: 14 Issue: 6, Jun. 1995, Page(s): 750–765.*

IEEE Std 1149.1–1990 IEEE standard test access port and boundary—scan architecture, p. 4.*

* cited by examiner

Primary Examiner—Albert Decady
Assistant Examiner—Joseph D. Torres
(74) Attorney, Agent, or Firm—Burns, Doane, Swecker & Mathis, LLP

(57) ABSTRACT

There is provided a boundary-scan test device incorporated into a semiconductor integrated circuit for running self-diagnostics on the semiconductor integrated circuit. The device comprises a bypass unit for, when a package in which the semiconductor integrated circuit is assembled does not have one or more corresponding external input/output pins associated with one or more predetermined boundary-scan registers, changing the length of a boundary-scan register chain that consists of a plurality of boundary-scan registers by bypassing the one or more predetermined boundary-scan registers according to a bypass control signal applied thereto.

14 Claims, 4 Drawing Sheets

BOUNDARY-SCAN TEST METHOD AND DEVICE

BACKGROUND OF THE INVENTION

1. Field of the Invention

The present invention relates to a boundary-scan test method and device-for running self-diagnostics on wiring and logic circuits in a semiconductor integrated circuit.

2. Description of the Prior Art

In recent years, a boundary-scan test method that complies with IEEE 1149.1 standard, which is known as Joint Test Action Group (JTAG), has been widely used as a method of running self-diagnostics on wiring and logic circuits in a semiconductor integrated circuit. Referring now to FIG. 6, there is illustrated a block diagram showing the structure of a semiconductor integrated circuit into which a boundary-scan test device using such a prior art boundary-scan test method is incorporated. In the figure, reference numeral 1 denotes an internal system logic, 2 denotes an input pin, 3 denotes an output pin, 6 denotes a test data input pin, which will be abbreviated as TDI, 7 denotes a test data output pin, which will be abbreviated as TDO, 8 denotes a test clock pin, which will be abbreviated as TCK, 9 denotes a test mode select pin, which will be abbreviated as TMS, 10 denotes a boundary-scan register chain, 11a denotes an input boundary-scan register which partially constitutes an input boundary portion of the boundary-scan register chain 10, 11b denotes an output boundary-scan register which partially constitutes an output boundary portion of the boundary-scan register chain 10, and 22 denotes a test access port controller, which will be abbreviated as TAPC.

Referring next to FIG. 7, there is illustrated a schematic circuit diagram showing the structure of each of the plurality of input boundary-scan registers 11a and output boundary-scan registers 11b as shown in FIG. 6. In FIG. 7, reference numeral 12 denotes an input multiplexer, 13 denotes a shift register stage, 14 denotes a parallel output stage, 15 denotes a data input signal, 16 denotes a shift data register signal, 17 denotes a clock data register signal, 18 denotes a update data register signal, and 19 denotes a data output signal.

In operation, each of the plurality of input boundary-scan registers 11a and output boundary-scan registers 11b, which are provided for the plurality of external input and output ports of the semiconductor integrated circuit as shown in FIG. 6, can perform either one of basic operations such as capturing, shifting, and updating, according to a transition in the state of the TAPC 22. In response to a test mode select signal applied to the TMS 9, the TAPC 22 makes a transition in its state and then applies a control signal having a value set according to its new state to a specified input or output boundary-scan register 11a or 11b. As a result, the specified input or output boundary-scan register 11a or 11b performs either one of the following basic operations according to the control signal applied thereto from the TAPC 22.

(1) Capture Operation

The input or output boundary-scan register 11a or 11b, which has been specified by a current instruction, captures a signal value from the internal system logic 1 and stores it into the shift register stage 13 thereof.

(2) Shift Operation (Scan Operation)

The input or output boundary-scan register 11a or 11b, which has been specified by a current instruction, performs scanning. When an input or output boundary-scan register 11a or 11b is specified by a current instruction, the boundary-scan register chain 10 is connected between the TDI 6 and the TDO 7 and the value of one bit of the specified input or output boundary-scan register 11a or 11b is shifted by one boundary-scan register towards the TDO 7 in synchronization with a test clock applied to the TCK 8.

(3) Update Operation

The input or output boundary-scan register 11a or 11b, which has been specified by a current instruction, updates the content of its parallel output stage 14. When an input or output boundary-scan register 11a or 11b is specified by a current instruction, data is then transferred from the shift register stage 13 of the specified input or output boundary-scan register 11a or 11b to the parallel output stage 14 in synchronization with the test clock applied to the TCK 8.

When the prior art boundary-scan test device as shown in FIG. 6 performs scanning, it needs to cause data to be passed through boundary-scan registers other than the boundary-scan register to which data is to be written or from which data is to be read. To overcome the drawback of the prior art boundary-scan test device, Japanese Patent Application Publication (KOKAI) No. 10-19983 discloses an improvement in the prior art boundary-scan test method, in which when writing data, by way of the TDI 6, into the plurality of input boundary scan registers 11a, for example, the plurality of output boundary-scan registers 11b are bypassed and the data is then written into only the plurality of input boundary-scan registers 11a.

A problem with the prior art boundary-scan test device of FIG. 6 constructed as above is that since the length of the boundary-scan register chain 10 that consists of the plurality of input and output boundary-scan registers 11a and 11b, i.e., the number of the plurality of boundary-scan registers is fixed, when assembling the semiconductor integrated circuit including the boundary-scan register chain 10 including the predetermined number of input and output boundary-scan registers 11a and 11b in a package having a lower number of input/output pins, there can exist one or more boundary-scan registers with no corresponding external input/output pin connected thereto, i.e., one or more boundary-scan registers that are invisible from outside the chip. The time required for scanning test is thus increased because of such extra boundary-scan registers. Furthermore, in the above case, it is difficult to use an automatic test pattern generating tool.

The above-mentioned improvement in the prior art boundary-scan test method as disclosed in Japanese Patent Application Publication (KOKAI) NO. 10-19983 cannot solve the above problem that arises when assembling the semiconductor integrated circuit in a package having a lower number of input/output pins, because it bypasses all of the plurality of output or input boundary-scan registers 11a or 11b at a time.

SUMMARY OF THE INVENTION

The present invention is made to overcome the above problem. It is therefore an object of the present invention to provide a boundary-scan test method and device, capable of changing the length of a boundary-scan register chain comprised of a plurality of boundary-scan registers according to the number of external input/output pins formed on a package in which the semiconductor integrated circuit is assembled.

In accordance with one aspect of the present invention, there is provided a boundary-scan test method of boundary-scan testing a semiconductor integrated circuit using a boundary-scan register chain, comprising the step of: changing the length of the boundary-scan register chain by bypassing one or more predetermined boundary-scan registers included in the boundary-scan register chain according to a bypass control signal applied.

In accordance with a preferred embodiment of the present invention, the boundary-scan test method further comprises the step of, when bypassing a boundary-scan register provided for an input port in a case that a package in which the semiconductor integrated circuit is assembled does not have one corresponding external input pin associated with the boundary-scan register, preventing the input port from floating.

In accordance with another aspect of the present invention, there is provided a boundary-scan test device which can be incorporated into a semiconductor integrated circuit for running self-diagnostics on the semiconductor integrated circuit, the device comprising: a boundary-scan register chain including a plurality of boundary-scan registers connected in series in a chain; and a bypass unit for, when a package in which the semiconductor integrated circuit is assembled does not have one or more corresponding external input/output pins associated with one or more predetermined boundary-scan registers, changing the length of the boundary-scan register chain by bypassing the one or more predetermined boundary-scan registers according to a bypass control signal applied thereto. The boundary-scan test device can comprise an external terminal for receiving the bypass control signal and for furnishing the bypass control signal received to the bypass unit.

In accordance with a preferred embodiment of the present invention, the boundary-scan test device can further comprise a fuse circuit for storing predetermined information, and for furnishing the bypass control signal having a value corresponding to the predetermined information to the bypass unit, instead of the external terminal for receiving the bypass control signal. Preferably, the boundary-scan test device can further comprise a through current preventing unit for, when the bypass unit bypasses one boundary-scan register disposed for an input port in a case that the package in which the semiconductor integrated circuit is assembled does not have one corresponding external input pin associated with the boundary-scan register, preventing the input port from floating. The through current preventing unit can be enabled according to the predetermined information stored in the fuse circuit disposed for furnishing the bypass control signal to the bypass unit. The through current preventing unit can include an AND gate having an input terminal to which an input floating mask signal at a low level is applied when bypassing the one boundary-scan register and an output terminal connected to the one boundary-scan register. The bypass control signal furnished by the fuse circuit can be applied, as the input floating mask signal, to the AND gate.

In accordance with another preferred embodiment of the present invention, the boundary-scan test device can further comprise a memory for storing predetermined information, and for furnishing the bypass control signal having a value corresponding to the predetermined information to the bypass unit, instead of the external terminal for receiving the bypass control signal. Preferably, the boundary-scan test device can further comprise a through current preventing unit for, when the bypass unit bypasses one boundary-scan register disposed for an input port in a case that the package in which the semiconductor integrated circuit is assembled does not have one corresponding external input pin associated with the boundary-scan register, preventing the input port from floating. The through current preventing unit can be enabled according to the predetermined information stored in the memory disposed for furnishing the bypass control signal to the bypass unit. The through current preventing unit can include an AND gate having an input terminal to which an input floating mask signal at a low level is applied when bypassing the one boundary-scan register and an output terminal connected to the one boundary-scan register. The bypass control signal furnished by the memory can be applied, as the input floating mask signal, to the AND gate.

Preferably, the bypass unit includes a switch for bypassing the predetermined one or more boundary-scan registers in response to the bypass control signal, and for connecting all remaining boundary-scan registers between a test data input disposed for receiving a test data and a test data output disposed for furnishing a test result data.

Further objects and advantages of the present invention will be apparent from the following description of the preferred embodiments of the invention as illustrated in the accompanying drawings.

DETAILED DESCRIPTION OF THE PREFERRED EMBODIMENTS

First Embodiment

Figure 1:
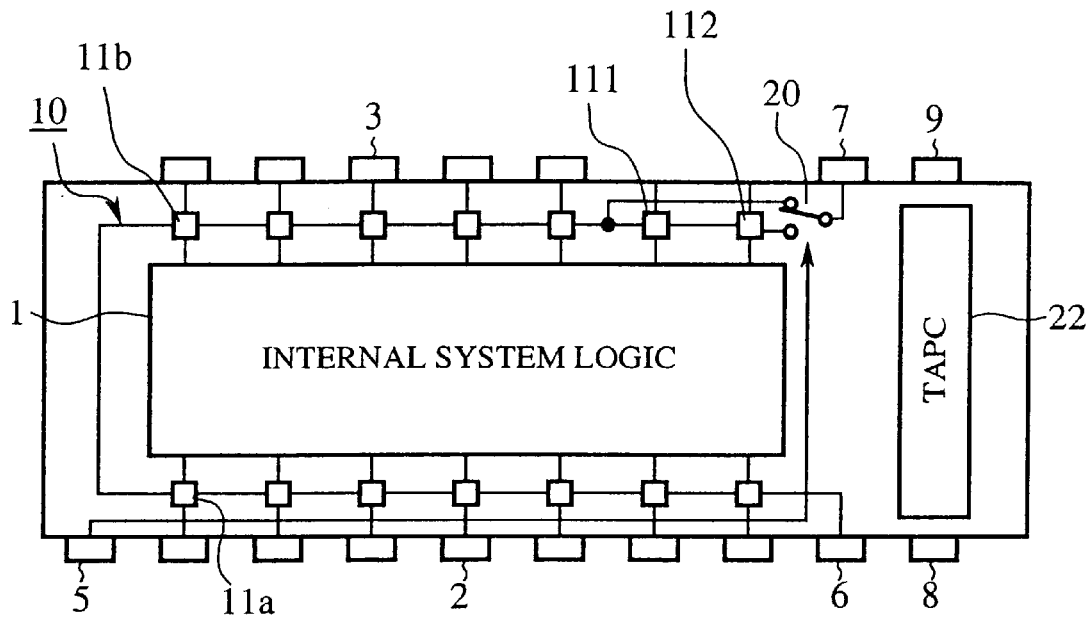
FIG. 1 is a block diagram showing the structure of a boundary-scan test device according to a first embodiment of the present invention.

Referring next to FIG. 1, there is illustrated a block diagram showing the structure of a semiconductor integrated circuit into which a boundary-scan test device using a boundary-scan test method according to a first embodiment of the present invention is incorporated. In the figure, reference numeral 1 denotes an internal system logic, 2 denotes an input pin, 3 denotes an output pin, 6 denotes a TDI via which the boundary-scan test device can receive a test data, 7 denotes a TDO via which the boundary-scan test device can furnish a test result data, 8 denotes a TCK, 9 denotes a TMS, 10 denotes a boundary-scan register chain, 11a denotes an input boundary-scan register which partially constitutes an input boundary portion of the boundary-scan register chain 10, 11b denotes an output boundary-scan register which partially constitutes an output boundary portion of the boundary-scan register chain 10, 5 denotes a bypass control signal input terminal to which a bypass control signal indicating whether or not one or more predetermined output (or input) boundary-scan registers 11b (or 11a) are bypassed is applied, 20 denotes a switch that can be turned on in response to the bypass control signal applied to the bypass control signal input terminal 5 to bypass the one or more predetermined output (or input) boundary-scan registers 11b (or 11a) and connect all the remaining boundary-scan registers between the TDI 6 and the TDO 7, and 22 denotes a TAPC.

In the example as shown in FIG. 1, the semiconductor integrated circuit in which the boundary-scan register chain 10, the internal system logic 1, and so on are disposed is assembled in a package having a lower number of external input/output pins than that of the input/output ports of the internal system logic 1. The package shown does not have two corresponding external output pins associated with two output ports of the internal system logic 1, which are connected to two output boundary-scan registers 111 and 112, respectively.

Figure 6:
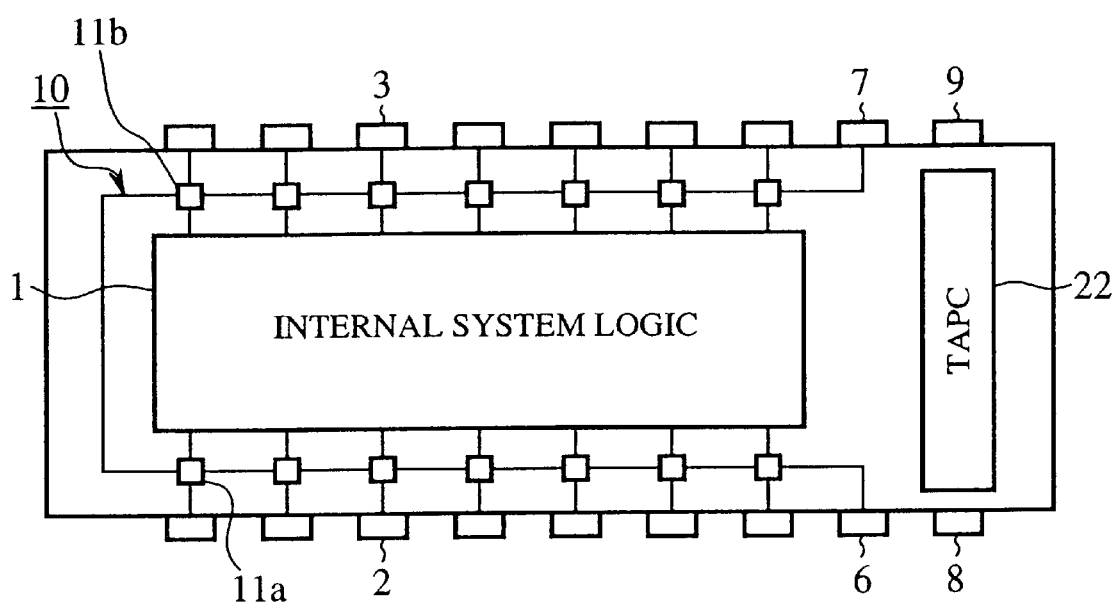
FIG. 6 is a block diagram showing the structure of a prior art boundary-scan test device.
Figure 7:
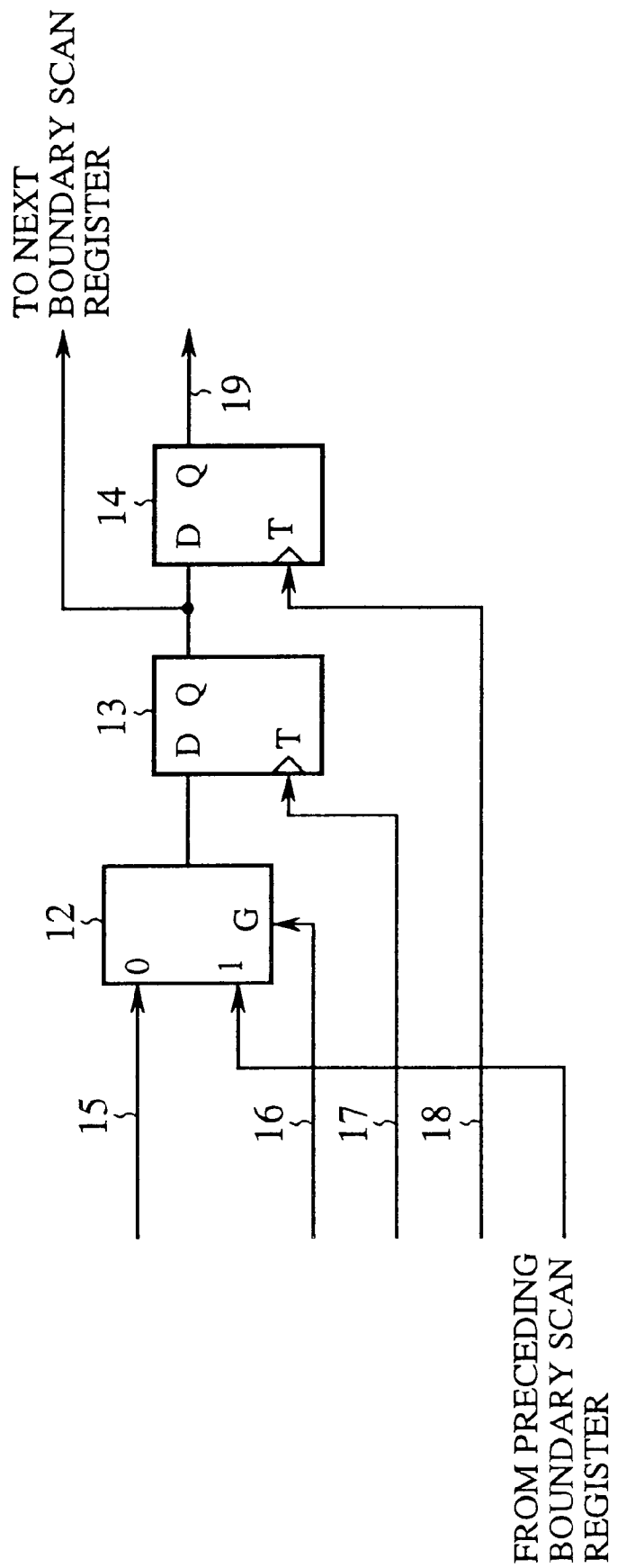
FIG. 7 is a schematic circuit diagram showing the structure of each boundary scan register included in the prior art boundary-scan test device of FIG. 6.

In operation, each of the plurality of input boundary-scan registers 11a and output boundary-scan registers 11b, which are provided for the plurality of input and output ports of the semiconductor integrated circuit as shown in FIG. 1, can perform either one of basic operations such as capturing, shifting, and updating, according to a transition in the state of the TAPC 22, like each boundary-scan register of the prior art boundary-scan test device mentioned above of FIG. 6. In response to a test mode select signal applied to the TMS 9, the TAPC 22 makes a transition in its state and then applies a control signal having a value set according to its new state to a specified input or output boundary-scan register 11a or 11b. As a result, the specified input or output boundary-scan register 11a or 11b performs either one of the basic operations such as capturing, shifting, and updating, according to the control signal applied thereto from the TAPC 22.

When the boundary-scan test device as shown in FIG. 1 carries out a shift operation, it receives, by way of the bypass control signal input terminal 5, the bypass control signal instructing for the boundary-scan test device to bypass the two predetermined output boundary-scan registers 111 and 112 and connect all the remaining boundary-scan registers 11a and 11b between the TDI 6 and the TDO 7. According to the value of the bypass control signal, the switch 20 is controlled to bypass the two predetermined output boundary-scan registers 111 and 112 and connect the boundary scan register chain consists of all the remaining boundary-scan registers 11a and 11b between the TDI 6 and the TDO 7. For example, when the bypass control signal at a low level (e.g., 0V) is applied to the bypass control signal input terminal 5, the switch 20 bypasses the two output boundary-scan registers 111 and 112. On the contrary, when the bypass control signal at a high level (e.g., 5V) is applied to the bypass control signal input terminal 5, the switch 20 connects the whole of the boundary-scan register chain 10 between the TDI 6 and TDO 7 without bypassing the two output boundary-scan registers 111 and 112. In this manner, the boundary-scan test device of the first embodiment can change the length of the boundary-scan register chain 10 by bypassing one or more input or output boundary-scan registers 11a or 11b with no corresponding external input/output pin connected thereto, i.e., one or more input or output boundary-scan registers 11a or 11b that are invisible from outside the chip, as needed.

As previously mentioned, according to the first embodiment of the present invention, the boundary-scan test device can bypass one or more predetermined output or input boundary-scan registers 11b or 11a included in the boundary-scan register chain 10 and connect all the remaining boundary-scan registers between the TDI 6 and the TDO 7, by turning on the switch 20 according to the value of the bypass control signal applied to the bypass control signal input terminal 5. Accordingly, when assembling a semiconductor integrated circuit including such the boundary-scan test device according to the first embodiment in a package with a lower number of external input/output pins, one or more boundary-scan registers 11a or 11b with no corresponding external input/output pin connected thereto, i.e., one or more boundary-scan registers 11a or 11b that are invisible from outside the chip can be bypassed. Since the length of the boundary-scan register chain 10 can thus be changed according to the number of external pins formed on the package, the time required for scanning test can be reduced. In addition, it is possible to use an automatic test pattern generating tool.

Second Embodiment

Figure 2:
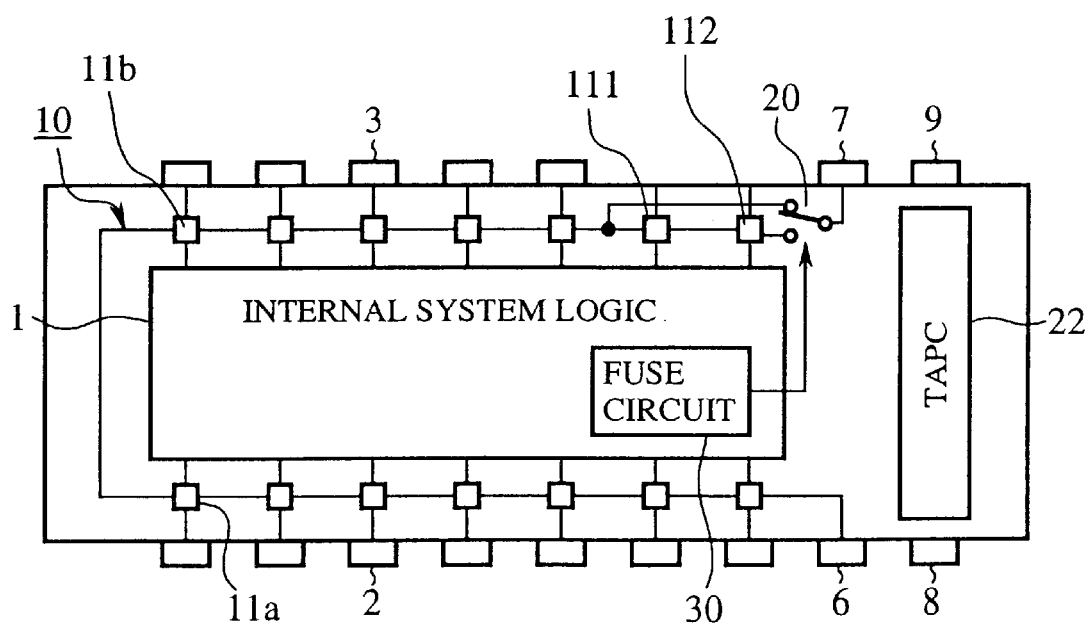
FIG. 2 is a block diagram showing the structure of a boundary-scan test device according to a second embodiment of the present invention.

Referring next to FIG. 2, there is illustrated a block diagram showing the structure of a semiconductor integrated circuit into which a boundary-scan test device using a boundary-scan test method according to a second embodiment of the present invention is incorporated. In the figure, the same reference numerals as shown in FIG. 1 designate the same components as those of the boundary-scan test device of the aforementioned first embodiment or like components, and therefore the description of the components will be omitted hereinafter.

In FIG. 2, reference numeral 30 denotes a programmable fuse circuit into which predetermined information can be written. In the example as shown in FIG. 2, the semiconductor integrated circuit in which the boundary-scan register chain 10, the internal system logic 1, and so on are disposed is assembled in a package having a lower number of external input/output pins than that of the input/output ports of the internal system logic 1, like the example as shown in FIG. 1. As shown in FIG. 2, the package does not have two corresponding external output pins associated with two output ports of the internal system logic 1, which are connected to two output boundary-scan registers 111 and 112, respectively.

In operation, each of the plurality of input boundary-scan registers 11a and output boundary-scan registers 11b, which are provided for the plurality of input and output ports of the semiconductor integrated circuit as shown in FIG. 2, can perform either one of basic operations such as capturing, shifting, and updating, according to a transition in the state of the TAPC 22, like each boundary-scan register of the boundary-scan test device of the above-mentioned first embodiment of the present invention. In response to a test mode select signal applied to the TMS 9, the TAPC 22 makes a transition in its state and then applies a control signal having a value set according to its new state to a specified input or output boundary-scan register 11a or 11b. As a result, the specified input or output boundary-scan register 11a or 11b performs either one of the basic operations such as capturing, shifting, and updating, according to the control signal applied thereto from the TAPC 22.

Before the boundary-scan test device as shown in FIG. 2 carries out a scan operation, it writes predetermined information instructing for itself to bypass the two predetermined output boundary-scan registers 111 and 112 and connect all the remaining boundary-scan registers 11a and 11b between the TDI 6 and the TDO 7 into the fuse circuit 30. The fuse circuit 30 furnishes a bypass control signal having a value according to the predetermined information stored therein to the switch 20. According to the value of the bypass control signal, the switch 20 is controlled to bypass the two predetermined output boundary-scan registers 111 and 112 and connect the boundary-scan register chain consists of all the remaining boundary-scan registers 11a and 11b between the TDI 6 and the TDO 7. For example, when the fuse circuit 30 furnishes the bypass control signal at a low level (e.g., 0V) to the switch 20 according to the predetermined information written thereinto, the switch 20 bypasses the two output boundary-scan registers 111 and 112. On the contrary, when the fuse circuit 30 furnishes the bypass control signal at a high level (e.g., 5V) to the switch 20 according to the predetermined information written thereinto, the switch 20 connects the whole of the boundary-scan register chain 10 between the TDI 6 and TDO 7 without bypassing the two output boundary-scan registers 111 and 112. In this manner, the boundary-scan test device of the second embodiment can change the length of the boundary-scan register chain 10 by bypassing one or more input or output boundary-scan registers 11a or 11b with no corresponding external input/output pin connected thereto, i.e., one or more input or output boundary-scan registers 11a or 11b that are invisible from outside the chip, as needed.

As previously mentioned, according to the second embodiment of the present invention, the boundary-scan test device can bypass one or more predetermined output or input boundary-scan registers 11b or 11a included in the boundary-scan register chain 10 and connect all the remaining boundary-scan registers between the TDI 6 and the TDO 7, by writing predetermined information into the fuse circuit 30, and then causing the fuse circuit 30 to furnish the bypass control signal to the switch 20 according to the predetermined information stored in the fuse circuit 30 to turn on the switch 20. Accordingly, when assembling a semiconductor integrated circuit including such the boundary-scan test device of the second embodiment in a package with a lower number of external input/output pins, one or more boundary-scan registers 11a or 11b with no corresponding external input/output pin connected thereto, i.e., one or more boundary-scan registers 11a or 11b that are invisible from outside the chip can be bypassed. Since the length of the boundary-scan register chain 10 can thus be changed according to the number of pins formed on the package, the time required for scanning test can be reduced. In addition, it is possible to use an automatic test pattern generating tool.

Third Embodiment

Figure 3:
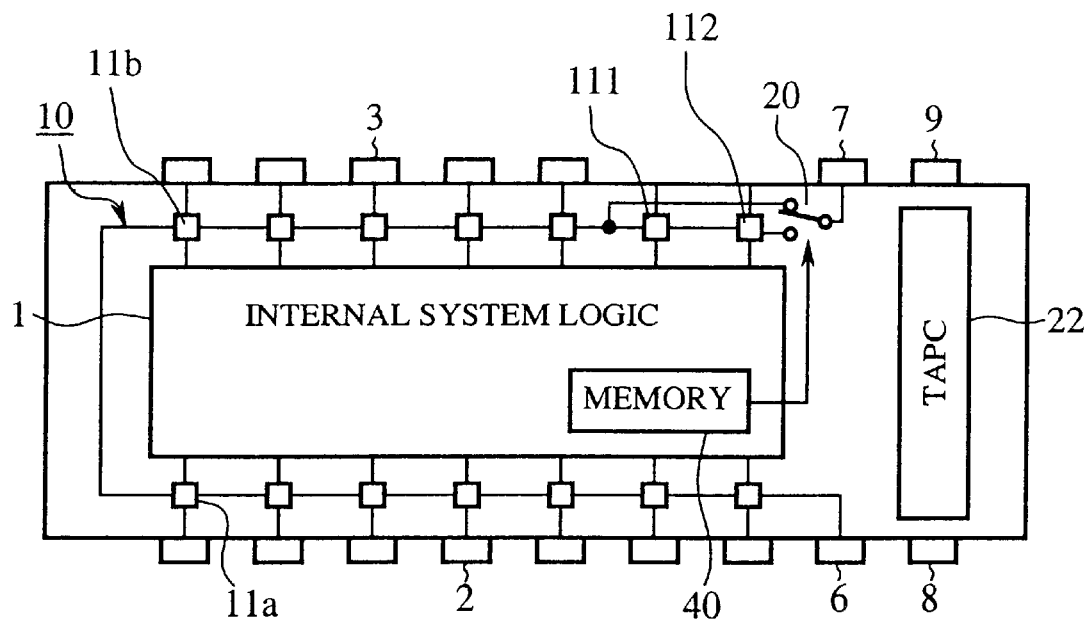
FIG. 3 is a block diagram showing the structure of a boundary-scan test device according to a third embodiment of the present invention.

Referring next to FIG. 3, there is illustrated a block diagram showing the structure of a semiconductor integrated circuit into which a boundary-scan test device using a boundary-scan test method according to a third embodiment of the present invention is incorporated. In the figure, the same reference numerals as shown in FIG. 1 designate the same components as those of the boundary-scan test device of the aforementioned first embodiment or like components, and therefore the description of the components will be omitted hereinafter.

In FIG. 3, reference numeral 40 denotes a memory into which predetermined information can be written. In the example as shown in FIG. 3, the semiconductor integrated circuit in which the boundary-scan register chain 10, the internal system logic 1, and so on are disposed is assembled in a package having a lower number of external input/output pins than that of the input/output ports of the internal system logic 1, like the example as shown in FIG. 1. As shown in FIG. 3, the package does not have two corresponding external output pins associated with two output ports of the internal system logic 1, which are connected to two output boundary-scan registers 111 and 112, respectively.

In operation, each of the plurality of input boundary-scan registers 11a and output boundary-scan registers 11b, which are provided for the plurality of input and output ports of the semiconductor integrated circuit as shown in FIG. 3, can perform either one of basic operations such as capturing, shifting, and updating, according to a transition in the state of the TAPC 22, like each boundary-scan register of the boundary-scan test device of the aforementioned first embodiment. In response to a test mode select signal applied to the TMS 9, the TAPC 22 makes a transition in its state and then applies a control signal having a value set according to its new state to a specified input or output boundary-scan register 11a or 11b. As a result, the specified input or output boundary-scan register 11a or 11b performs either one of the basic operations such as capturing, shifting, and updating, according to the control signal applied thereto from the TAPC at 22.

Before the boundary-scan test device as shown in FIG. 3 carries out a scan operation, it writes predetermined information instructing for itself to bypass the two predetermined output boundary-scan registers 111 and 112 and connect all the remaining boundary-scan registers 11a and 11b between the TDI 6 and the TDO 7 into the memory 40. The memory 40 furnishes a bypass control signal having a value according to the predetermined information stored therein to the switch 20. According to the value of the bypass control signal, the switch 20 is controlled to bypass the two predetermined output boundary-scan registers 111 and 112 and connect the boundary-scan register chain consists of all the remaining boundary-scan registers 11a and 11b between the TDI 6 and the TDO 7. For example, when the memory 40 furnishes the bypass control signal at a low level (e.g., 0V) to the switch 20 according to the predetermined information written thereinto, the switch 20 bypasses the two output boundary-scan registers 111 and 112. On the contrary, when the memory 40 furnishes the bypass control signal at a high level (e.g., 5V) to the switch 20 according to the predetermined information written thereinto, the switch 20 connects the whole of the boundary-scan register chain 10 between the TDI 6 and TDO 7 without bypassing the two output boundary-scan registers 111 and 112. In this manner, the boundary-scan test device of the third embodiment can change the length of the boundary-scan register chain 10 by bypassing one or more input or output boundary-scan registers 11a or 11b with no corresponding external input/output pin connected thereto, i.e., one or more input or output boundary-scan registers 11a or 11b that are invisible from outside the chip, as needed.

As previously mentioned, according to the third embodiment of the present invention, the boundary-scan test device can bypass one or more predetermined output or input boundary-scan registers 11b or 11a included in the boundary-scan register chain 10 and connect all the remaining boundary-scan registers between the TDI 6 and the TDO 7, by writing predetermined information into the memory 40, and then causing the memory 40 to furnish the bypass control signal according to the predetermined information stored in the memory 40 to turn on the switch 20. Accordingly, when assembling a semiconductor integrated circuit including the boundary-scan test device of the third embodiment in a package with a lower number of external input/output pins, one or more boundary-scan registers 11a or 11b with no corresponding external input/output pin connected thereto, i.e., one or more boundary-scan registers 11a or 11b that are invisible from outside the chip can be bypassed. Since the length of the boundary-scan register chain 10 can thus be changed according to the number of pins formed on the package, the time required for scanning test can be reduced. In addition, it is possible to use an automatic test pattern generating tool.

Fourth Embodiment

Figure 4:
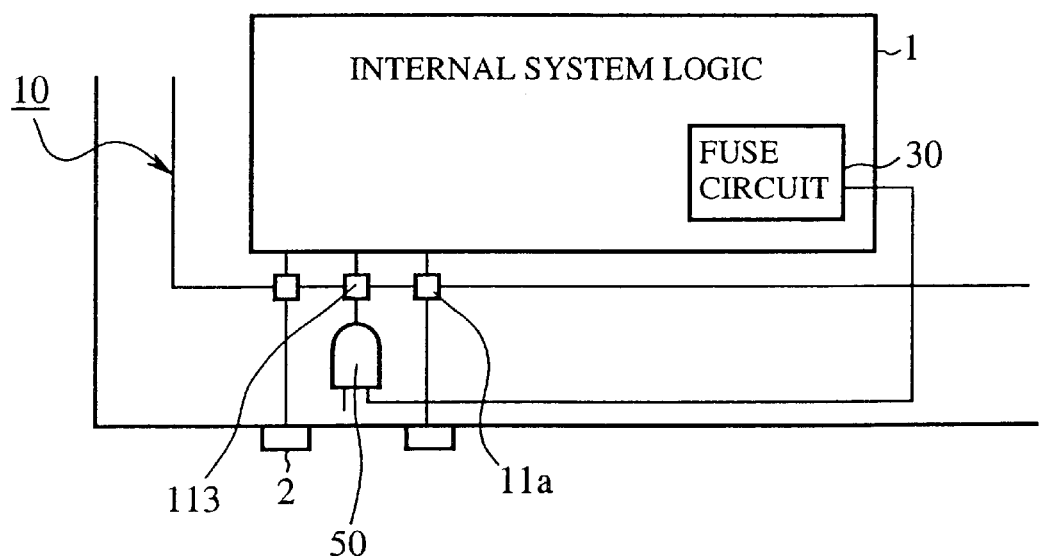
FIG. 4 is a block diagram showing the structure of a boundary-scan test device according to a fourth embodiment of the present invention.

Referring next to FIG. 4, there is illustrated a block diagram showing the structure of a semiconductor integrated circuit into which a boundary-scan test device using a boundary-scan test method according to a fourth embodiment of the present invention is incorporated. In the figure, the same reference numerals as shown in FIG. 2 designate the same components as those of the boundary-scan test device of the aforementioned second embodiment or like components, and therefore the description of the components will be omitted hereinafter.

In FIG. 4, reference numeral 50 denotes an AND gate having an input terminal connected to a fuse circuit 30. The AND gate 50 has an output terminal connected to one input boundary-scan register 113, which is connected to one input port of an internal system logic 1 with no corresponding external input pin which is to be connected to the input port. In the example as shown in FIG. 4, the semiconductor integrated circuit in which the boundary-scan register chain 10, the internal system logic 1, and so on are disposed is assembled in a package having a lower number of external input pins than that of the input ports of the internal system logic 1. As shown in FIG. 4, the package does not have a corresponding external input pin associated with the input port of the internal system logic 1 which is connected to the input boundary-scan register 113.

In operation, each of the plurality of input boundary-scan registers 1a and output boundary-scan registers (not shown), which are provided for the plurality of input and output ports of the semiconductor integrated circuit as shown in FIG. 4, can perform either one of basic operations such as capturing, shifting, and updating, according to a transition in the state of the TAPC 22, like each boundary-scan register of the boundary-scan test device of either one of the aforementioned first to third embodiments. In response to a test mode select signal applied to the TMS 9, the TAPC 22 makes a transition in its state and then applies a control signal having a value set according to its new state to a specified input or output boundary-scan register. As a result, the specified input or output boundary-scan register performs either one of the basic operations such as capturing, shifting, and updating, according to the control signal applied thereto from the TAPC 22. Before the boundary-scan test device as shown in FIG. 4 carries out a scan operation, it writes predetermined information instructing for itself to bypass the predetermined input boundary-scan register 113 into the fuse circuit 30. The fuse circuit 30 then furnishes a bypass control signal having a value according to the predetermined information stored therein to a switch (not shown). According to the value of the bypass control signal, the switch is controlled to bypass the predetermined input boundary-scan register 113 and connect the boundary-scan register chain consists of all the remaining boundary-scan registers between a TDI (not shown) and a TDO (not shown). For example, when the fuse circuit 30 furnishes the bypass control signal at a low level (e.g., 0V) according to the predetermined information written thereinto, the switch not shown bypasses the input boundary-scan register 113. On the contrary, when the fuse circuit 30 furnishes the bypass control signal at a high level (e.g., 5V) according to the predetermined information written thereinto, the switch not shown connects the whole of the boundary-scan register chain 10 between the TDI and TDO without bypassing the input boundary-scan register 113.

When the input boundary-scan register 113 is bypassed, the bypass control signal from the fuse circuit 30 is also applied, as an input floating mask signal, to the input boundary-scan register 113 by way of the AND gate 50. At that time, since the bypass control signal is at a low level of 0V, for example, the input boundary-scan register 113 is forcedly brought into a low level (that is, it is grounded). This results in preventing the input boundary-scan register 113 from being held in a floating state and hence masking or preventing a floating input to the corresponding input port of the internal system logic 1, thus preventing a current from flowing into and passing through the internal system logic 1. In this manner, the boundary-scan test device of the fourth embodiment can also use the bypass control signal from the fuse circuit 30 in order to prevent floating inputs when bypassing one or more input scan registers.

As previously mentioned, according to the fourth embodiment of the present invention, the boundary-scan test device can bypass one or more predetermined output or input boundary-scan registers included in the boundary-scan register chain 10 and connect all the remaining boundary-scan registers between the TDI and the TDO, by writing predetermined information into the fuse circuit 30, and then causing the fuse circuit 30 to furnish the bypass control signal according to the predetermined information stored in the fuse circuit 30 to turn on the switch. Accordingly, when assembling a semiconductor integrated circuit including such the boundary-scan test device of the fourth embodiment in a package with a lower number of external input/output pins, one or more boundary-scan registers with no corresponding external input/output pin connected thereto, i.e., one or more boundary-scan registers 11a or 11b that are invisible from outside the chip can be bypassed. Since the length of the boundary-scan register chain 10 can thus be changed according to the number of pins formed on the package, the time required for scanning test can be reduced. In addition, it is possible to use an automatic test pattern generating tool. Furthermore, when bypassing one ore more predetermined input boundary-scan registers 11a, the boundary-scan test device can prevent a floating input to one ore more corresponding input ports of the internal system logic 1, thus preventing a current from flowing into and passing through the internal system logic 1.

Fifth Embodiment

Figure 5:
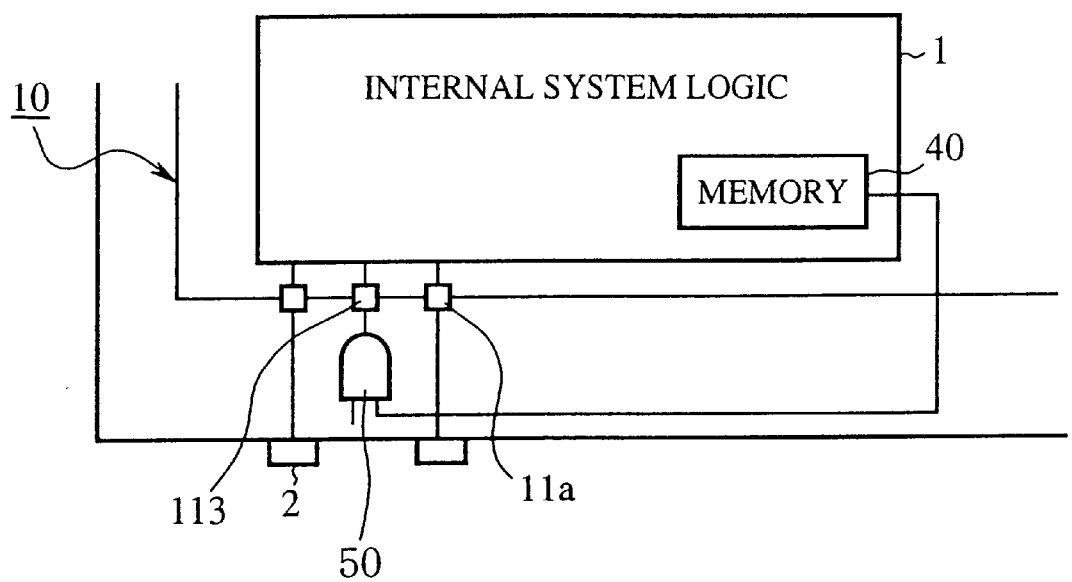
FIG. 5 is a block diagram showing the structure of a boundary-scan test device according to a fifth embodiment of the present invention.

Referring next to FIG. 5, there is illustrated a block diagram showing the structure of a semiconductor integrated circuit into which a boundary-scan test device using a boundary-scan test method according to a fifth embodiment of the present invention is incorporated. In the figure, the same reference numerals as shown in FIGS. 3 and 4 designate the same components as those of the boundary-scan test devices of the aforementioned second and fourth embodiments or like components, and therefore the description of the components will be omitted hereinafter.

In the example as shown in FIG. 5, the semiconductor integrated circuit in which a boundary-scan register chain 10, an internal system logic 1, and so on are disposed is assembled in a package having a lower number of external input pins than that of the input ports of the internal system logic 1. As shown in FIG. 5, the package does not have a corresponding external input pin associated with the input port of the internal system logic 1 which is connected to an input boundary-scan register 113.

In operation, each of the plurality of input boundary-scan registers 11a and output boundary-scan registers (not shown), which are provided for the plurality of input and output ports of the semiconductor integrated circuit as shown in FIG. 5, can perform either one of basic operations such as capturing, shifting, and updating, according to a transition in the state of a TAPC (not shown), like each boundary-scan register of the boundary-scan test device of either one of the aforementioned first to third embodiments. In response to a test mode select signal applied to a TMS (not shown), the TAPC makes a transition in its state and then applies a control signal having a value set according to its new state to a specified input or output boundary-scan register. As a result, the specified input or output boundary-scan register performs either one of the basic operations such as capturing, shifting, and updating, according to the control signal applied thereto from the TAPC. Before the boundary-scan test device as shown in FIG. 5 carries out a scan operation, it writes predetermined information instructing for itself to bypass the predetermined input boundary-scan register 113 into the memory 40. The memory 40 then furnishes a bypass control signal having a value according to the predetermined information stored therein to a switch (not shown). According to the value of the bypass control signal, the switch is controlled to bypass the predetermined input boundary-scan register 113 and connect the boundary-scan register chain 10 consists of all the remaining boundary-scan registers between a TDI (not shown) and a TDO (not shown). For example, when the memory 40 furnishes the bypass control signal at a low level (e.g., 0V) according to the predetermined information written thereinto, the switch not shown bypasses the input boundary-scan register 113. On the contrary, when the memory 40 furnishes the bypass control signal at a high level (e.g., 5V) according to the predetermined information written thereinto, the switch not shown connects the whole of the boundary-scan register chain 10 between the TDI and TDO without bypassing the input boundary-scan register 113.

When the input boundary-scan register 113 is bypassed, the bypass control signal from the memory 40 is also applied, as an input floating mask signal, to the input boundary-scan register 113 by way of an AND gate 50. At that time, since the bypass control signal is at a low level of 0V, for example, the input boundary-scan register 113 is forcedly brought into a low level (that is, it is grounded). This results in preventing the input boundary-scan register 113 from being held in a floating state and hence masking or preventing a floating input to the corresponding input port of the internal system logic 1, thus preventing a current from flowing into and passing through the internal system logic 1. In this manner, the boundary-scan test device of the fifth embodiment can also use the bypass control signal from the memory 40 in order to prevent floating inputs when bypassing one or more input scan registers.

As previously mentioned, according to the fifth embodiment of the present invention, the boundary-scan test device can bypass one or more predetermined output or input boundary-scan registers included in the boundary-scan register chain 10 and connect all the remaining boundary-scan registers between the TDI and the TDO, by writing predetermined information into the memory 40, and then causing the memory 40 to furnish the bypass control according to the predetermined information stored in the memory 40 to turn on the switch. Accordingly, when assembling a semiconductor integrated circuit including such the boundary-scan test device of the fifth embodiment in a package with a lower number of external input/output pins, one or more boundary-scan registers with no corresponding external input/output pin connected thereto, i.e., one or more boundary-scan registers 11a or 11b that are invisible from outside the chip can be bypassed. Since the length of the boundary-scan register chain 10 can thus be changed according to the number of pins formed on the package, the time required for scanning test can be reduced. In addition, it is possible to use an automatic test pattern generating tool. Furthermore, when bypassing one or more predetermined input boundary-scan registers 11a, the boundary-scan test device can prevent a floating input to one ore more corresponding input ports of the internal system logic 1, thus preventing a current from flowing into and passing through the internal system logic 1.

Many widely different embodiments of the present invention may be constructed without departing from the spirit and scope of the present invention. It should be understood that the present invention is not limited to the specific embodiments described in the specification, except as defined in the appended claims.

What is claimed is:

1. A boundary-scan test method of boundary-scan testing a semiconductor integrated circuit using a boundary-scan register chain including a plurality of boundary-scan registers connected in series in a chain incorporated in a package, wherein said boundary-scan registers are provided for external ports comprising the step of:

when a package in which said semiconductor integrated circuit is assembled lacks at least one external input/output pin corresponding to said boundary-scan registers, bypassing a same number of said boundary-scan registers as the number of missing external input/output pins via a circuit path which is separate from bypassed boundary-scan registers a response to a bypass control signal.

2. The boundary-scan test method according to claim 1, further comprising the step of, when bypassing a boundary-scan register provided for an input port in a case where a package in which said semiconductor integrated circuit is assembled does not have one corresponding external input pin associated with said boundary-scan register, preventing said input port from floating.

3. A boundary-scan test device which can be incorporated into a semiconductor integrated circuit for running self-diagnosis on said semiconductor integrated circuit, said device comprising:

a boundary-scan register chain including a plurality of boundary-scan registers connected in series in a chain wherein said boundary-scan registers are provided for external ports;

a bypass circuit provided separately from the boundary-scan register chain for bypassing a same number of boundary-scan registers as the number of missing external input/output pins; and bypass means for, when a package in which said semiconductor integrated circuit is assembled lacks at least one external input/output pin corresponding to said boundary-scan registers, switching a circuit path to the bypass circuit in response to a bypass control signal, one end of which is connected to the boundary-scan register chain and the other end of which is connected to the bypass circuit.

4. The boundary-scan test device according to claim 3, further comprising an external terminal for receiving the bypass control signal and for furnishing the received bypass control signal to said bypass means.

5. The boundary-scan test device according to claim 4, wherein said bypass means includes a switch for bypassing said predetermined one or more boundary-scan registers in response to the bypass control signal, and for connecting all remaining boundary-scan registers between a test data input disposed for receiving a test data and a test data output disposed for furnishing a test result data.

6. The boundary-scan test device according to claim 3, further comprising a memory for storing predetermined information, and for furnishing the bypass control signal having a value corresponding to said predetermined information to said bypass means.

7. The boundary-scan test device according to claim 6, wherein said bypass means includes a switch for bypassing said predetermined one or more boundary-scan registers in response to the bypass control signal, and for connecting all remaining boundary-scan registers between a test data input disposed for receiving a test data and a test data output disposed for furnishing a test result data.

8. The boundary-scan test device according to claim 6, further comprising through current preventing means for, when said bypass means bypasses one boundary-scan register disposed for an input port, preventing said input port from floating, wherein said through current preventing means is enabled according to said predetermined information stored in said memory disposed for furnishing the bypass control signal to said bypass means.

9. The boundary-scan test device according to claim 8, wherein said through current preventing means includes an AND gate having an input terminal to which an input floating mask signal at a low level is applied when bypassing said one boundary-scan register and an output terminal connected to said one boundary-scan register, wherein the bypass control signal furnished by said memory is applied, as the input floating mask signal, to said AND gate.

10. The boundary-scan test device according to claim 3, wherein said bypass means include a switch for bypassing said predetermined one or more boundary-scan registers in response to the bypass control signal, and for connecting all remaining boundary-scan registers between a test data input disposed for receiving a test data and a test data output disposed for furnishing a test result data.

11. A scan test device which can be incorporated into a semiconductor integrated circuit for running self-diagnosis on said semiconductor integrated circuit, said device comprising:

a scan register chain including a plurality of scan registers connected in series in a chain;

a bypass circuit provided separately from the scan register chain for bypassing a same number of scan registers as the number of missing external input/output pins;

bypass means for, when a package in which said semiconductor integrated circuit is assembled lacks at least one external input/output pin corresponding to said scan registers, changing the length of said scan register chain by switching a circuit path to the bypass circuit according to a bypass control signal applied thereto, one end of which is connected to the scan register chain and the other end of which is connected to the bypass circuit; and a fuse circuit for storing predetermined information, and for furnishing the bypass control signal having a value corresponding to said predetermined information to said bypass means.

12. The scan test device according to claim 11, wherein said bypass means includes a switch for bypassing said predetermined one ore more scan registers in response to the bypass control signal, and for connecting all remaining boundary-scan registers between a test data input disposed for receiving a test data and a test data output disposed for furnishing a test result data.

13. The scan test device according to claim 11, further comprising through current preventing means for, when said bypass means bypasses one scan register disposed for an input port, preventing said input port from floating, wherein said through current preventing means is enabled according to said predetermined information stored in said fuse circuit disposed for furnishing the bypass control signal to said bypass means.

14. The scan test device according to claim 13, wherein said through current preventing means includes an AND gate having an input terminal to which an input floating mask signal at a low level is applied when bypassing said one scan register and an output terminal connected to said one scan register, wherein the bypass control signal furnished by said fuse circuit is applied, as the input floating mask signal, to said AND gate.

* * * * *